United States Patent [19]

Tani et al.

[11] Patent Number: 5,290,723
[45] Date of Patent: Mar. 1, 1994

[54] METHOD OF MANUFACTURING A NONVOLATILE SEMICONDUCTOR MEMORY

[75] Inventors: Tomofune Tani; Kenji Anzai, both of Tokyo, Japan

[73] Assignee: Nippon Steel Corporation, Tokyo, Japan

[21] Appl. No.: 951,011

[22] Filed: Sep. 25, 1992

[30] Foreign Application Priority Data

Sep. 26, 1991 [JP] Japan .................................. 3-274683

[51] Int. Cl.[5] ............................................ H01L 21/76
[52] U.S. Cl. ...................................... 437/43; 437/228; 437/48; 437/52; 257/314; 257/315
[58] Field of Search .................. 437/43, 48, 60, 52, 437/51, 228; 156/643, 657; 257/295-298, 390, 391

[56] References Cited

U.S. PATENT DOCUMENTS

| 5,002,896 | 3/1991 | Naruke | 437/48 |
| 5,091,327 | 2/1992 | Bergemont | 437/43 |
| 5,110,753 | 5/1992 | Gill et al. | 437/43 |
| 5,114,872 | 9/1992 | Roselle et al. | 437/48 |

OTHER PUBLICATIONS

"Reviews and Prospects of Non-Volatile Semiconductor Memories", IEICE Transactions vol. E 74, No. 4 Apr. 1991, pp. 868–874.

"A 2.3 um² Memory Cell Structure for 16 Mb NAND ERROMS", IEDM 90 pp. 103–106.

*Primary Examiner*—Olik Chaudhuri
*Assistant Examiner*—Richard A. Booth
*Attorney, Agent, or Firm*—Pollock, Vande Sande & Priddy

[57] ABSTRACT

A method of manufacturing a nonvolatile semiconductor memory including forming a first insulating film, a first semiconductor film for forming floating gates, a second insulating film, and a second semiconductor film for forming control gates in that order on a semiconductor substrate, and forming etching masks, each having a configuration corresponding to that of the floating gate, at every other one of areas on the second semiconductor film where the floating gates are to be formed. Side wall spacers are formed on both side walls of each of the etching masks and a third semiconductor film, formed of the same material as that of the second semiconductor film is selectively grown on parts of the second semiconductor film which are not covered by any of the etching masks and the side wall spacers. Then the side wall spacers are removed and the second semiconductor film under the side wall spacers, the second insulating film and the first semiconductor film, together with the third semiconductor film in a direction substantially perpendicular to a surface of the semiconductor substrate by using the etching masks.

6 Claims, 2 Drawing Sheets

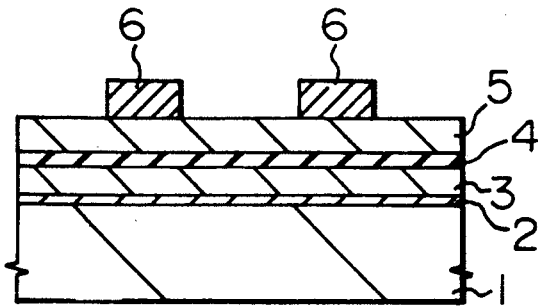
FIG. IA
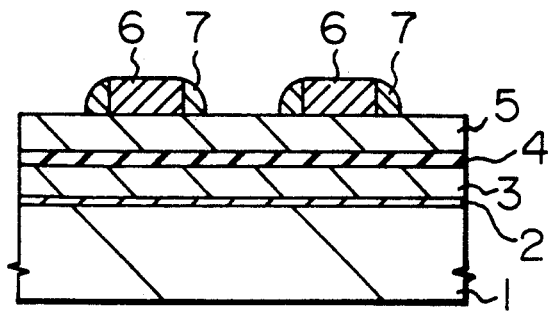
FIG. IB
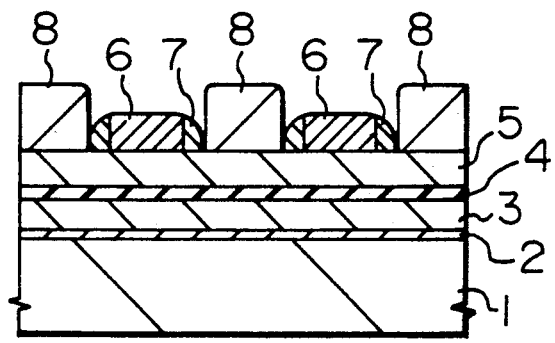
FIG. IC
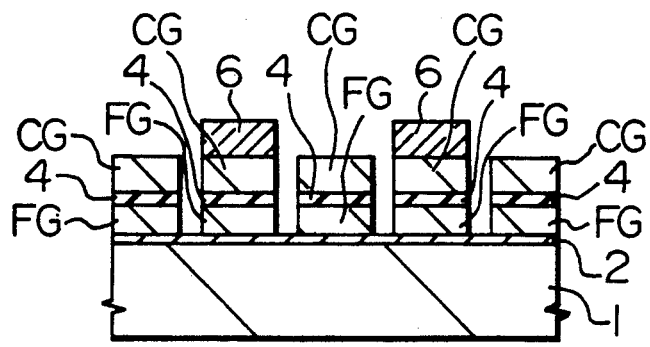
FIG. ID

METHOD OF MANUFACTURING A NONVOLATILE SEMICONDUCTOR MEMORY

BACKGROUND OF THE INVENTION

1. Field of the Invention

The present invention relates to a method of manufacturing a nonvolatile semiconductor memory and more particularly to a method of manufacturing a floating-gate nonvolatile semiconductor memory having a reduced gate space.

2. Description of the Related Art

EEPROM is a nonvolatile read only semiconductor memory in which information can be electrically written or erased. Thus, EEPROM is widely used for a microcomputer. A memory cell employing EEPROM is, for example, disclosed in an article "Reviews and Prospects of Non-Volatile Semiconductor Memories", IEICE TRANSACTIONS VOL. E 74, NO. 4, April 1991, pp. 868–874.

In the EEPROM, it is prevailed to write or erase information by injecting or discharging electrons into or from a floating gate through a thin oxide film formed on a drain region of a memory transistor by the tunnel current of Fowler-Nordheim.

For the purpose of improving the integration density in such a floating-gate EEPROM, the reduction of both the length of each floating gate and the space between every two floating gates has been developed. For this purpose, in the photolithography process for forming the floating gate, the exposure is performed by a reduced projection aligner.

However, even when the exposure is performed by the reduced projection aligner, there is a limit in reduction of both the length of each floating gate and the space between every two floating gates due to the resolution of the reduced projection aligner. For example, in the case of the aligner employing an i ray with 365 nm wavelength, the minimum dimension is limited to 0.5 $\mu$m. Therefore, there is also a limit in integration of EEPROM.

As for a method of manufacturing EEPROM wherein the space between the floating gates is reduced to less than the minimum dimension which is determined by the resolution of the reduced projection aligner, there is known a method disclosed in an article "A 2.3 $\mu m^2$ Memory Cell Structure For 16 Mb NAND EEPROMs", IEDM 90 pp. 103–106 for example. In this method, however, it is necessary to form etching masks such that each etching mask has a configuration corresponding to the gate configuration and the etching masks are disposed at positions where the gates are to be formed with a space between two adjacent etching masks near the limit of the resolution of the reduced projection aligner, and to form a photo resist film of narrow width within the space so as not to contact with the etching masks adjacent thereto. Therefore, it involves a problem that it is practically difficult to perform the positioning of the photo resist film.

SUMMARY OF THE INVENTION

It is therefore an object of the present invention to provide a method of manufacturing a nonvolatile semiconductor memory which is capable of reducing a space between floating gates to less than the minimum dimension which is determined by the resolution of a reduced projection aligner thereby greatly improving the density in integration, and which has less practical difficulty.

In order to solve the above-mentioned problems, a method of manufacturing a nonvolatile semiconductor memory, according to the present invention, comprises the steps of: forming a first insulating film, a first semiconductor film for forming floating gates, a second insulating film and a second semiconductor film for forming control gates successively on a semiconductor substrate; forming etching masks at every other one of the areas where floating gates are to be formed on the second semiconductor film such that each etching mask has a configuration corresponding to that of the floating gate; forming side wall spacers on both side walls of each etching mask; growing a third semiconductor film selectively on a part of said second semiconductor film which is not covered by any of said etching masks and said side wall spacers; removing the side wall spacers; and etching the second semiconductor film, the second insulating film and the first semiconductor film in a direction substantially perpendicular to a surface of the semiconductor substrate using the etching masks.

In a preferred aspect of the present invention, a thickness of the third semiconductor film which is selectively grown on the second semiconductor film is set to a value not less than the total thickness of the first semiconductor film and the second semiconductor film.

According to the method of manufacturing a nonvolatile semiconductor memory according to the present invention as mentioned-above, the second semiconductor film, the second insulating film and the first semiconductor film are selectively etched in a direction substantially perpendicular to the surface of the semiconductor substrate by using the etching masks, whereby a lamination part of the second semiconductor film, the second insulating film and the first semiconductor film disposed between each etching mask and the third semiconductor film selectively grown on the second semiconductor film are removed. At that time, the third semiconductor film as selectively grown on the second semiconductor film is also finally removed.

As a result, the floating gate made of the first semiconductor film and the control gate made of the second semiconductor film are formed under each etching mask, and at the same time the floating gate and the control gate are also formed at an area where the third semiconductor film was selectively grown on the second semiconductor film. In this case, the space between the adjacent floating gates is equal to the width of the side wall spacer formed on the side wall of each etching mask. Then, the width of the side wall spacer can be reduced to less than the minimum dimension which is determined by the resolution of the reduced projection aligner.

Therefore, the space between the floating gates can be reduced to less than the minimum dimension which is determined by the resolution of the reduced projection aligner. As a result, it is possible to greatly improve the density in integration of the nonvolatile semiconductor memory.

BRIEF DESCRIPTION OF THE DRAWINGS

FIGS. 1A to 1D are cross sectional views showing the steps of manufacturing process of a floating-gate EEPROM according to one embodiment of the present invention.

DESCRIPTION OF THE PREFERRED EMBODIMENTS

Figures 2A, 2B:
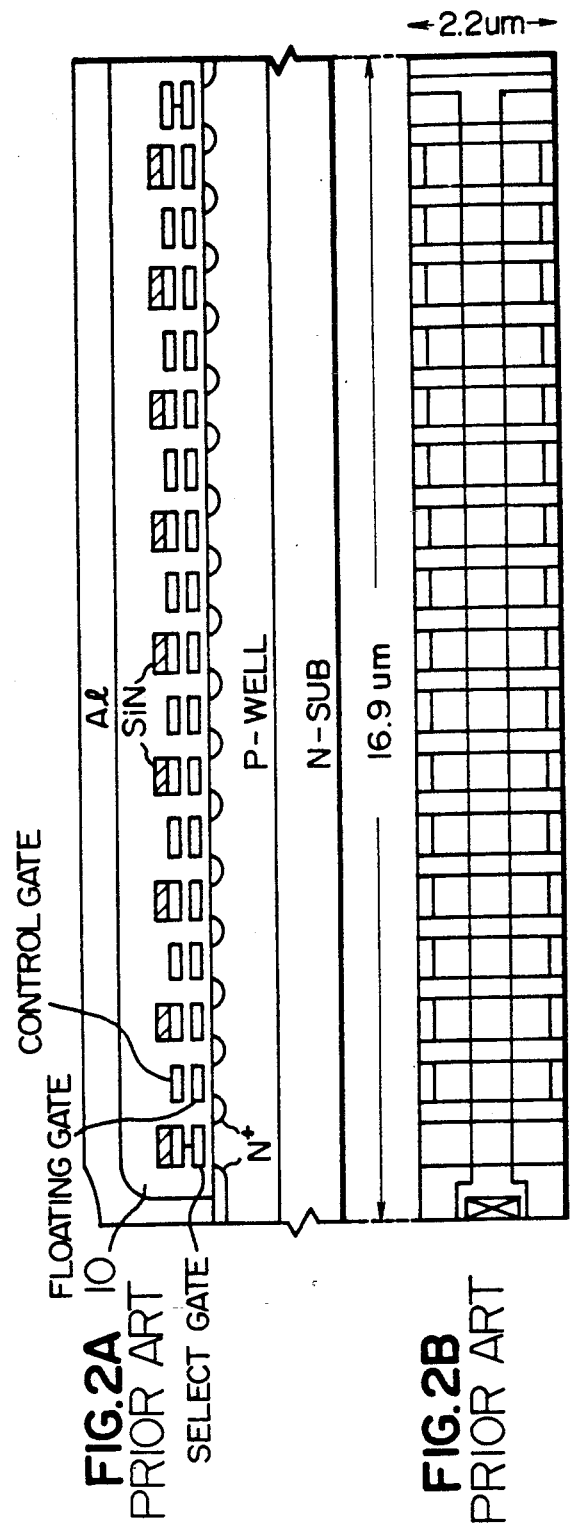
FIGS. 2A and 2B are respectively a cross sectional view and a top view showing a configuration of a nonvolatile semiconductor memory cell to which EEPROMs manufactured according to the present invention are applicable.

The preferred embodiment of the present invention will hereinafter be described referring to FIGS. 1A to 1D.

In the present embodiment, as shown in FIG. 1A, first, a gate insulating film 2 such as a silicon dioxide ($SiO_2$) film is formed on a silicon (Si) substrate 1 by the thermal oxidation process. The thickness of the gate insulating film 2 is set to about 10 nm, for example. Next, a polycrystalline silicon (polysilicon) film 3 for forming floating gates is formed on the gate insulating film 2 by the CVD process. The thickness of the polycrystalline Si film 3 is set to about 200 nm, for example. Subsequently, an interlayer insulating film (coupling insulating film) 4 such as a $SiO_2/Si_3N_4/SiO_2$ composite film is formed on the polycrystalline Si film 3, of which $SiO_2$ is formed by the thermal oxidation process and $Si_3N_4$ is formed by the CVD process. The thickness of the interlayer insulating film 4 is set to about 20 nm, for example. Thereafter, a polycrystalline Si film 5 for forming control gates is formed on the interlayer insulating film 4 by the CVD process. The thickness of the polycrystalline Si film 5 is set to about 400 nm, for example.

Next, after a silicon nitride ($Si_3N_4$) film having a thickness of about 100 nm for example is formed on the polycrystalline Si film 5 by the CVD process, a photo resist pattern (not shown) including elements each having a configuration corresponding to that of the floating gate is formed on the $Si_3N_4$ film by the photolithography technique by using a reduced projection exposer such that the elements are disposed at every other one of the areas where the floating gates are to be formed. Then, the $Si_3N_4$ film is selectively etched by using the resist pattern as an etching mask. As a result, elementary etching masks 6, each made of $Si_3N_4$ and having a configuration corresponding to that of the floating gate to be formed, are formed at every other one of the areas where the floating gates are to be formed on the polycrystalline Si film 5. The width of each etching mask 6 can be set to the minimum dimension, for example, 0.5 μm which is determined by the resolution of the reduced projection aligner.

Next, a film of $SiO_2$ is formed on the whole surface of the substrate body by the CVD process, for example and then this $SiO_2$ film is etched back in a direction perpendicular to the surface of the substrate body by the anisotropic etching technique such as the RIE (reactive ion etching) process, thereby to form side wall spacers 7 made of $SiO_2$ on both side walls of each etching mask 6 as shown in FIG. 1B. In this case, the etch back is performed in such a way that the space between the opposing side wall spacers 7 is equal to the width of each etching mask 6, that is, the length of the floating gate. In this case, the width of the side wall spacer 7 can be reduced to less than the minimum dimension which is determined by the resolution of the reduced projection aligner. More specifically, the side wall spacer 7 can be formed so as to have a very small width equal to or less than 200 to 300 nm. Moreover, the width of the side wall spacer 7 is made smaller, as the thickness of the $SiO_2$ film formed on the polysilicon film 5 which is formed on the etching masks 6 becomes smaller, and made smaller as the thickness of the etching mask 6 becomes larger. Thus, the width of the side wall spacer 7 can be controlled by controlling the thickness of the $SiO_2$ film and that of the etching mask 6.

Next, as shown in FIG. 1C, a film 8 of polycrystalline Si, for example, is selectively grown by self-alignment with the side wall spacers 7 on parts of the polycrystalline Si film 5 which are not covered by the etching masks 6 and the side wall spacers 7, that is, which are exposed between the opposing side wall spacers 7. The thickness of this Si film 8 is set to be larger than the total thickness of the polycrystalline Si film 3 and the polycrystalline Si film 5.

Subsequently, all of the side wall spacers 7 are removed by the wet etching process using a hydrogen fluoride series etchant for example. Next, the polycrystalline Si film 5, the interlayer insulating film 4 and the polycrystalline Si film 3 are selectively etched by using the etching masks 6 in this order in a direction perpendicular to the surface of the substrate by the RIE process, for example. By this etching, a lamination part of the polycrystalline Si film 5, the interlayer insulating film 4 and the polycrystalline Si film 3 disposed between each etching mask 6 and the Si film 8 formed by the selective growth is removed in a slit. Finally, the Si film 8 is also removed. In this connection, since the thickness of the Si film 8 is set to larger than the total thickness of the polycrystalline Si films 3 and 5, the lamination part of those films is removed in a slit before the Si film 8 is removed. As a result, as shown in FIG. 1D, floating gates FG each of which is made of the polycrystalline Si film 3, and control gates CG each of which is made of the polycrystalline Si film 5 and laminated on the polycrystalline Si film 3 through the interlayer insulating film 4 are formed at the same intervals equal to the width of the side wall spacer 7.

Subsequently, after the etching masks 6 are removed by etching, the process is advanced in accordance with the conventional EEPROM manufacturing process to make a desired EEPROM.

As described above, according to the present invention, the floating gates FG can be formed at the same intervals equal to the width of the side wall spacer. Then, the width of the side wall spacer 7 can be set at less than the minimum dimension which is determined by the resolution of the reduced projection aligner. Thus, the space between the floating gates FG can be reduced to less than the minimum dimension which is determined by the resolution of the reduced projection aligner. Therefore, it is possible to manufacture EEPROM having higher integration density than that of the prior art EEPROM.

Although the present invention has been described with reference to one embodiment, the present invention is not limited thereto. That is, it will be understood that variations may be made by those skilled in the art without departing from the spirit of the present invention.

For example, as the material of the above-mentioned etching mask 6, a suitable material other than the $Si_3N_4$ film may be used. Moreover, as the material of the side wall spacer 7, suitable material other than the $SiO_2$ film may be used. Further, as for the material of the control gate CG, a polycide film in which a refractory metal silicide film is laminated on a polycrystalline silicon film can be employed.

The floating-gate EEPROMs which are manufactured in accordance with the method of the present invention are applicable to a nonvolatile semiconductor memory cell, as disclosed in "A 2.3 $\mu m^2$ Memory Cell Structure For 16 Mb EEPROMs", IEDM 90 pp. 103-106 for example, in which sixteen memory transistors 10 are arranged between two select transistors in series as shown in FIGS. 2A and 2B. In this case, the integration density thereof can be greatly increased by using the EEPROMS manufactured by the method of the invention.

We claim:

1. A method of manufacturing a nonvolatile semiconductor memory, comprising the steps of:
   (a) forming a first insulating film, a first semiconductor film for forming floating gates, a second insulating film, and a second semiconductor film for forming control gates in that order on a semiconductor substrate;
   (b) forming etching masks, each having a configuration corresponding to that of the floating gate, at every other one of ares on said second semiconductor film where the floating gates are to be formed;
   (c) forming side wall spacers on both side walls of each of said etching masks;
   (d) growing selectively a third semiconductor film formed of the same material as that of said second semiconductor film on parts of said second semiconductor film which are not covered by any of said etching masks and said side wall spacers;
   (e) removing said side wall spacers; and
   (f) etching selectively said second semiconductor film, under said side wall spacers, said second insulating film and said first semiconductor film, together with said third semiconductor film in a direction substantially perpendicular to a surface of said semiconductor substrate by using said etching masks.

2. A method according to claim 1, wherein in the step of forming said side wall spacers, a length of a space between the side wall spacers is controlled.

3. A method according to claim 1, wherein a thickness of said third semiconductor film is larger than the total thickness of said first semiconductor film and said second semiconductor film.

4. A method according to claim 1, wherein in said etching step, slit-like parts in lamination of said first semiconductor film, said second insulating film and said second semiconductor film disposed between said etching masks and said third semiconductor film are etched and finally said third semiconductor film formed by said selective growth is also removed.

5. A method according to claim 1, wherein said side wall spacers are removed by wet etching.

6. A method according to claim 5, wherein said second semiconductor film, said second insulating film and said first semiconductor film are etched together with said third semiconductor film by reactive ion etching after said side wall spacers are removed by the wet etching.

* * * * *